United States Patent [19]

Hirotomi

[11] Patent Number: 5,142,249

[45] Date of Patent: Aug. 25, 1992

[54] CURRENT-CONTROLLED OSCILLATOR CONTROLLED BY CONTROL VOLTAGE AND STORED DATA

[75] Inventor: Jun Hirotomi, Tokyo, Japan

[73] Assignee: Seiko Instruments Inc., Japan

[21] Appl. No.: 606,540

[22] Filed: Oct. 31, 1990

[30] Foreign Application Priority Data

Nov. 27, 1989 [JP] Japan ................................. 1-308414

[51] Int. Cl.$^5$ ............................................. H03B 5/02
[52] U.S. Cl. ..................................... 331/57; 331/111; 331/177 R; 331/179
[58] Field of Search ................. 331/57, 108 C, 108 D, 331/111, 177 R, 179

[56] References Cited

U.S. PATENT DOCUMENTS

| | | | |
|---|---|---|---|
| 4,254,504 | 3/1981 | Lewis et al. | 455/76 |
| 4,494,080 | 1/1985 | Call | 331/8 |
| 4,570,130 | 2/1986 | Grindel et al. | 331/177 R X |
| 4,806,883 | 2/1989 | Tamura et al. | 331/177 R X |
| 4,862,015 | 8/1989 | Grandfield | 307/270 |

FOREIGN PATENT DOCUMENTS 2168560 6/1986 United Kingdom .

OTHER PUBLICATIONS

Patent Abstracts of Japan, vol. 13, No. 53, Feb. 7, 1989 (E-713).
Patent Abstracts of Japan, vol. 5, No. 153, Sep. 26, 1981 (E-076).

Primary Examiner—Siegfried H. Grimm
Attorney, Agent, or Firm—Bruce L. Adams; Van C. Wilks

[57] ABSTRACT

A current controlled signal processor adjusts the characteristics of an output frequency of a current controlled type oscillation circuit in accordance with stored information. A control current is generated dependent on the stored information. The output frequency of a current controlled oscillator varies dependent on the control current. The stored information may be altered, thereby allowing for the altering of the output frequency of the current controlled oscillator without requiring replacement or addition of electronic elements. Also, the present invention makes it possible to assemble the current controlled signal processor circuits into one integrated chip.

7 Claims, 6 Drawing Sheets

| $a_0$ | $a_1$ | $a_2$ | $I_1$ | FIG. 4(A) |
|---|---|---|---|---|
| 0 | 0 | 0 | 0.25 $I_{TR}$ | ① |
| 1 | 0 | 0 | 0.5 $I_{TR}$ | ② |
| 0 | 1 | 0 | 0.75 $I_{TR}$ | ③ |
| 1 | 1 | 0 | 1.0 $I_{TR}$ | ④ |
| 0 | 0 | 1 | 1.25 $I_{TR}$ | ⑤ |
| 1 | 0 | 1 | 1.5 $I_{TR}$ | ⑥ |
| 0 | 1 | 1 | 1.75 $I_{TR}$ | ⑦ |
| 1 | 1 | 1 | 2.0 $I_{TR}$ | ⑧ |

| b₀ | b₁ | b₂ | Voffset | FIG. 5(A) |
|---|---|---|---|---|
| 0 | 0 | 0 | 4.375V | V₀ |
| 1 | 0 | 0 | 3.75 V | V₁ |
| 0 | 1 | 0 | 3.125V | V₂ |
| 1 | 1 | 0 | 2.50 V | V₃ |
| 0 | 0 | 1 | 1.875V | V₄ |
| 1 | 0 | 1 | 1.25 V | V₅ |
| 0 | 1 | 1 | 0.625V | V₆ |
| 1 | 1 | 1 | 0 V | V₇ |

CURRENT-CONTROLLED OSCILLATOR CONTROLLED BY CONTROL VOLTAGE AND STORED DATA

BACKGROUND OF THE INVENTION

The present invention relates to a current-controlled oscillator controlled by a control voltage and stored data.

In a conventional voltage controlled oscillator, a variable resistor 701 shown in FIG. 7 is provided in order to change voltage characteristics of an output frequency. In order to change an absolute value of the output frequency, a variable resistor 702 shown in FIG. 7 may be provided. As an alternative, to change the absolute value a condensor may be replaced by a different condensor.

In conventional voltage control type oscillation circuits, a variable resistor has a minimum size of $5 \times 5 \times 2$ mm. On the other hand, a resistor element has a size of about $2 \times 3 \times 1$ mm. It is impractical to mount these elements on a small-sized device such as a wristwatch in which a packaging area for electric parts is limited. Moreover, it is extremely difficult to exchange the elements.

SUMMARY OF THE INVENTION

An object of the present invention is to provide a means to adjust the changing rate and absolute value of the output frequency to the voltage of a voltage control type oscillation circuit without requiring the variable resistors described above, or other elements attached to an IC. Thereby, in accordance with the present invention the packaging area is drastically reduced.

In order to solve the above-specified problems, in accordance with the present invention, a current control type oscillation circuit and a current control circuit for changing the changing rate of the electric current to the control voltage in accordance with the electric information are combined to make it possible to easily set the output frequency characteristics relative to the control voltage and to assemble those circuits into one chip thereby to adjust the frequency characteristics of the oscillator without requiring any external element.

According to the structure described above, the output frequency characteristics of the oscillation circuit can be adjusted without any external element, to thereby reduce the packaging area.

DETAILED DESCRIPTION OF THE PREFERRED EMBODIMENT

The present invention will be described with reference to the accompanying drawings.

Figure 1:
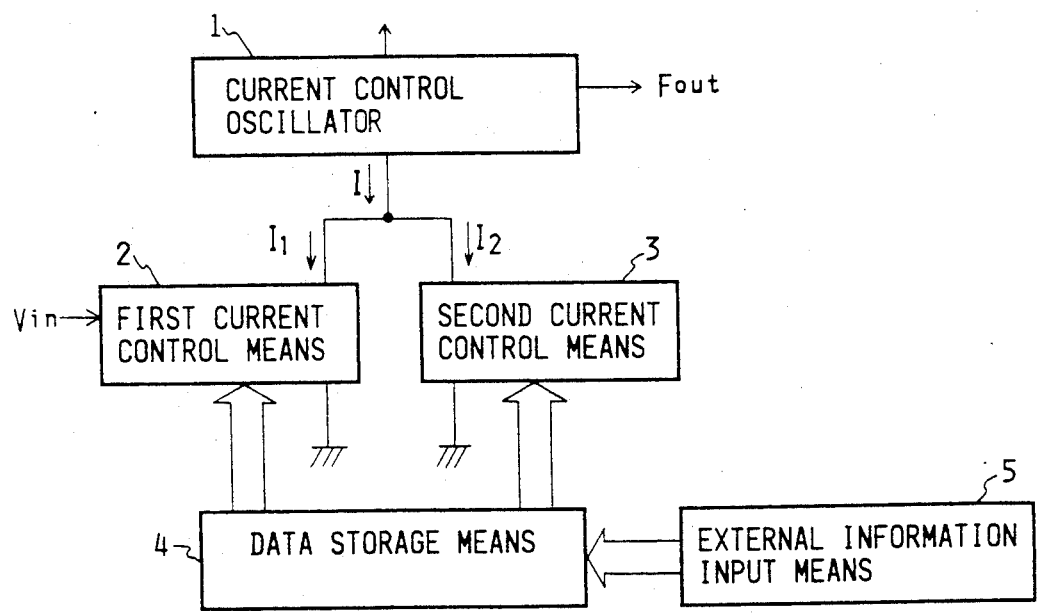
FIG. 1 is a functional block diagram showing the embodiment of the present invention.

In FIG. 1, current controlled type oscillation means 1 generates an output frequency $F_{out}$ variable in accordance with an inputted electric current. The current controlled oscillation means 1 is fed with the control current from controlled current generating means including first current control means 2 and second current control means 3. The first current control means 2 can change its current in accordance with an external control voltage and the rate of change of the current to the control voltage on the basis of data stored in data storage means 4. On the other hand, the second current control means 3 feeds an electric current in accordance with data stored in the aforementioned data storage means 4. External information input means 5 for inputting data is connected with data storage means 4.

Figure 2:
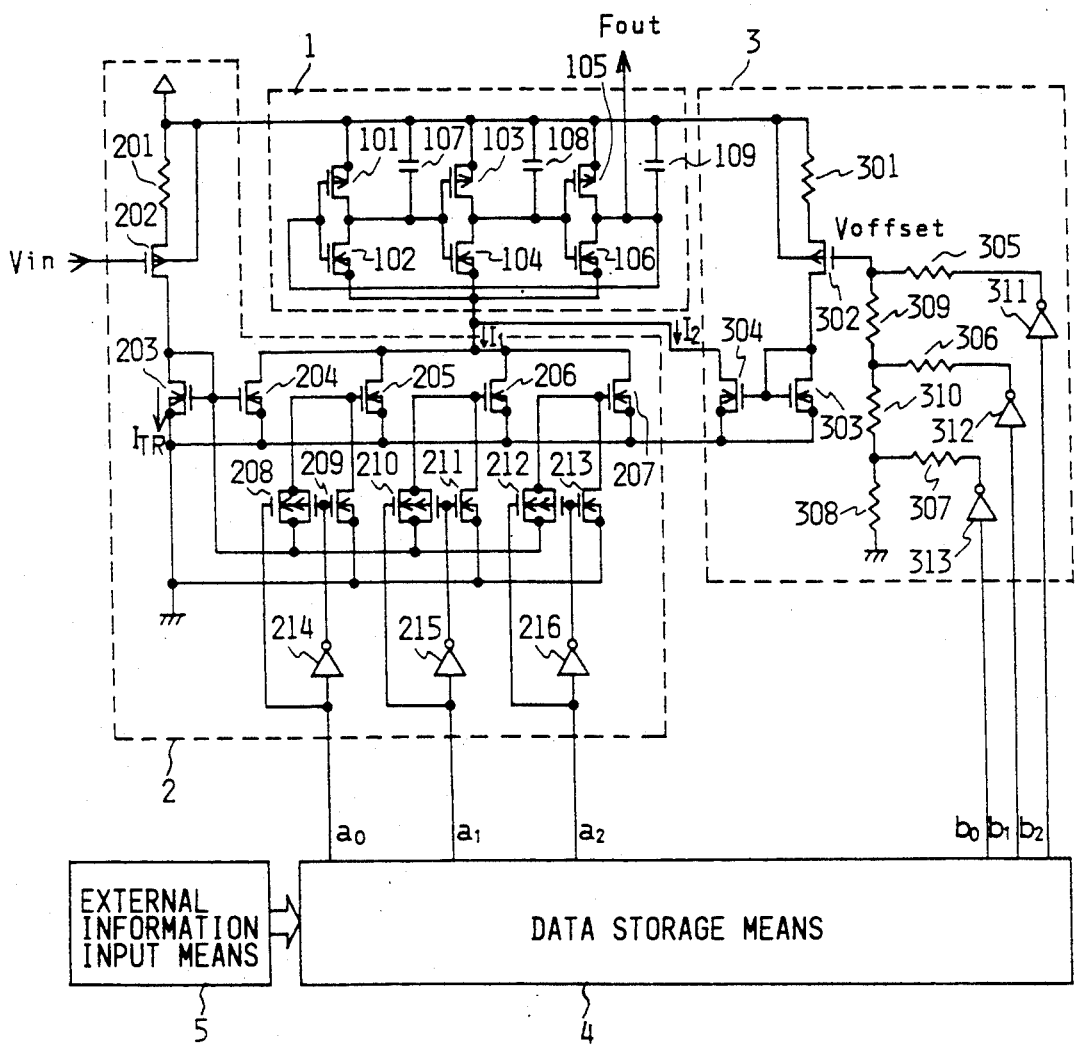
FIG. 2 is a circuit diagram showing an embodiment of the present invention using MOS transistors.
Figure 3:
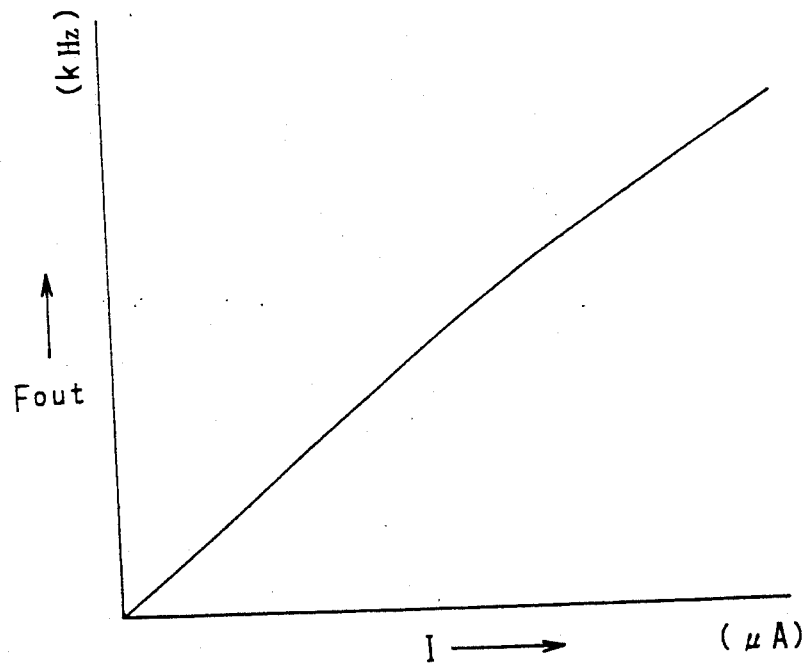
FIG. 3 is a diagram showing the relation between the current and frequency of the current control type oscillation means.

FIG. 2 is a circuit diagram showing the present invention utilizing MOS transistors. The current-frequency characteristics of the current controlled oscillation means 1 are shown in FIG. 3. The current into the aforementioned current controlled oscillation means 1 is controlled by both N-type transistors 204 to 207 of the first current control means 2 and an N-type transistor 304 of the second current control means 3 so that the frequency $F_{out}$ is outputted according to the current.

A transistor 203 is connected in a saturated manner, and the transistors 204 to 207 constitute a current mirror circuit together with the transistor 203. If the transistors 204 to 207 have a voltage $V_T$ (i.e., a threshold voltage) equal to that of the transistor 203, the current into the transistor 204 is expressed by $(K204/K203) \times I_{TR}$. Here, $I_{TR}$ expresses the current into the transistor 203, and $K_n$ expresses the K-value of a transistor n, where:

$$K_n = \frac{m \cdot z \cdot Cox}{2L}$$

m = surface mobility of the channel carrier
Z = width of the channel
L = length of the channel
Cox = capacitance between the silicon substrate and the gate. Likewise, currents of $(K205/K203) \times I_{TR}$, $(K206/K203) \times I_{TR}$ and $(K207/K203) \times I_{TR}$ will flow through the transistors 205 to 207. If the currents into the transistors 204 to 207 are generally represented by $I_1$ this value $I_1$ can be expressed, as follows:

$$I_1 = I_{TR} \times (K204 + K205 + K206 + K207)/K203 \quad (1)$$

The transistors 205 to 207 are fed with gate signals through switching means including analog switches 208, 210 and 212. When these analog switches 208, 210 and 212 are turned OFF, transistors 209, 211 and 213 are turned ON. Then, the gate voltage of the individual transistors 205 to 207 are dropped to 0 [V] so that current will not flow. In other words, whether or not the currents flow through the transistors 205 to 207 can be controlled in accordance with control signals $a_0$, $a_1$ and $a_2$ of the data storage means 4. The control signals $a_0$, $a_1$ and $a_2$ are inverted respectively by the inverter elements 214, 215 and 216, and inputted into Tr 208—213. The analog switches are turned ON for $a_0$ to $a_2 = 1$ and OFF for $a_0$ to $a_2 = 0$. Hence, the Equation (1) can be repressed in the following form:

$$I_1 = I_{TR} \times (K204 + a_0 \times K205 + a_1 \times K206 + a_2 \times K207)/K203 \quad (2)$$

Let it here be assumed that the individual K values be tabulated, $K203 = 100$, $K204 = 25$, $K205 = 25$, $K206 = 50$, and $K207 = 100[\mu A/V^2]$.

In this case, the following Equation is obtained from the Equation (2):

$$I_1 = I_{TR} \times (1 + a_0 + 2a_1 + 4a_2)/4 \quad (3)$$

The value $I_1$ takes its minimum of $I_{1min} = 0.25 I_{TR}$ for $a_0$ to $a_2 = 0$ and its maximum of $I_{1max} = 2 I_{TR}$ for $a_0$ to $a_2 = 1$. In other words, the value $I_1$ can be arbitrarily set in accordance with the values $a_0$ to $a_2$.

Figure 4:
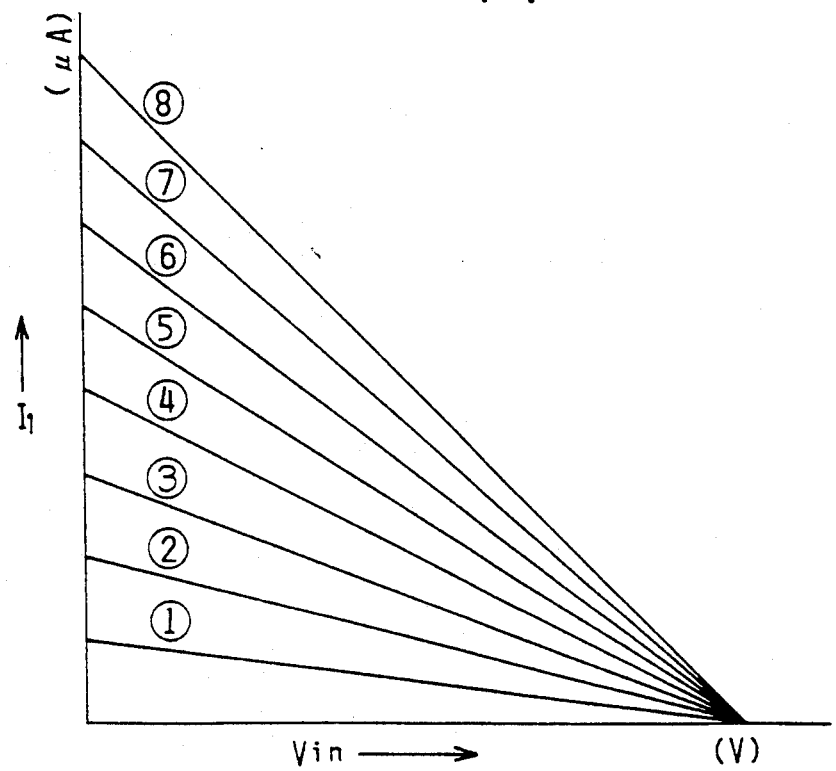
FIG. 4(A) is a diagram showing the relation between the voltage $V_{in}$ and current $I_2$ of the first current control means.
FIG. 4(B) is a diagram showing the relation between $a_0$, $a_1$, $a_2$ and $I_1$.

FIG. 4(A) shows the relations between the voltage $V_{in}$ and the current $I_2$ of the first current control means, and FIG. 4(B) shows the relations between $a_0 - a_2$ and $I_1$.

Figures 5A, 5B:
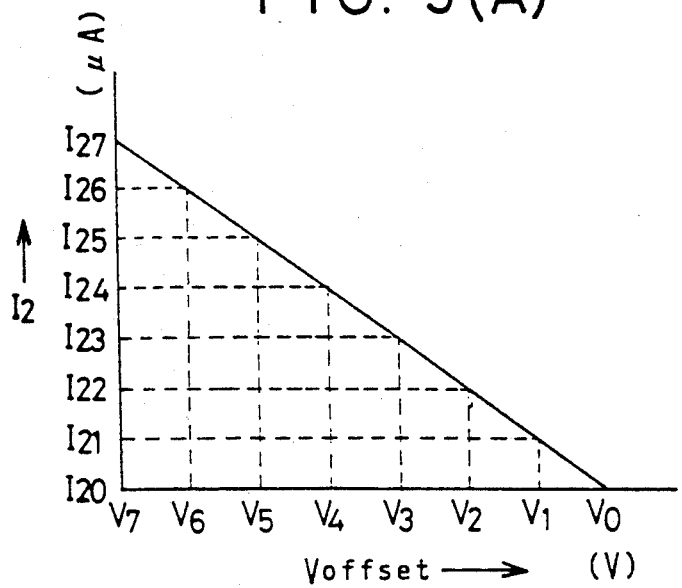
FIG. 5(A) is a diagram showing the relation between the control voltage effect and the current $I_2$.
FIG. 5(B) is a diagram showing the relation between $b_0$, $b_1$, $b_2$ and $V_{offset}$.

The fundamental operation of the second current control means 3 are identical to those of the aforementioned first current control means. The relation between a control voltage $V_{offset}$ and the current to flow into the transistor 304 is plotted in FIG. 5(A). Here, the voltage $V_{offset}$ is one to be determined according to the values of control signals $b_0$ to $b_2$ of the data storage means 4. Resistors 309 and 310 have an equal resistance, and resistors 305 to 308 also have an equal resistance two times as high as that of the resistors 309 and 310. The relations between the values $b_0$ to $b_2$ and the voltage $V_{offset}$ of $V_{DD} \times 5$ [v] and GND $= 0$[v] are shown in FIG. 5(B).

Since the voltage $V_{offset}$ is determined in dependence upon the values $b_0$ to $b_2$, the current $I_2$ to flow into the transistor 304 is automatically determined. The current I through the current controlled oscillator 1 is defined as $$I = I_1 + I_2.$$

Figure 6:
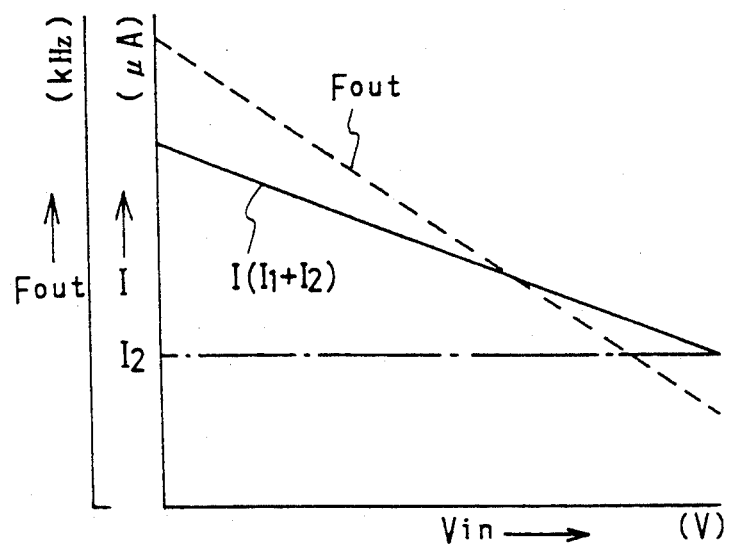
FIG. 6 is a diagram showing the relations between the control voltage $V_{in}$ and the current I and output frequency $F_{out}$ of the circuit shown in FIG. 2.
Figure 7:
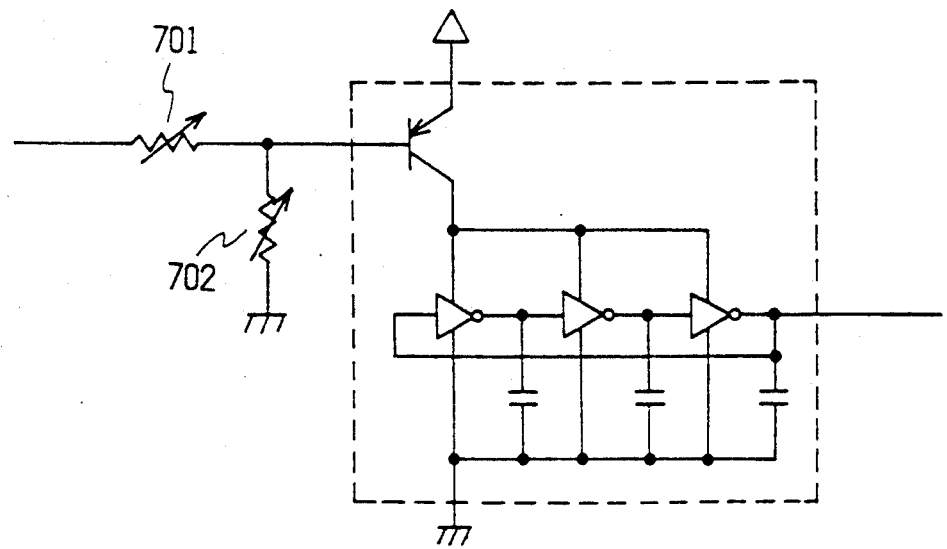
FIG. 7 is a circuit diagram showing an embodiment of the prior art voltage control type oscillation circuit.

The output frequency of the current controlled oscillator 1 varies with the current I. The current $I_1$ can be controlled in accordance with the control signals $a_0$, $a_1$ and $a_2$. The current $I_2$ can be controlled in accordance with the control signals $b_0$, $b_1$ and $b_2$. Therefore, the frequency characteristics of the output $F_{out}$ of the current controlled oscillator 1 can be altered by changing the values of $a_0$, $a_1$ and $a_2$, and $b_0$, $b_1$ and $b_2$. FIG. 6 shows the ($V_{in} = F_{out}$) and I characteristics after the first current control means and the second current control means have been adjusted.

According to the present invention, the output characteristics of the voltage control type oscillator can be digitally adjusted in their gradient and offset frequency without requiring the exchanging of variable resistors or elements.

What is claimed is:

1. A current controlled signal processor, comprising:
   a current controlled oscillator having an output frequency which changes with a control current;
   data storage means for storing and holding an electric signal;
   external information input means for inputting electric signal information to said data storage means;
   first current control means for controlling the current which flows into the current controlled oscillator dependent on an external control voltage and an output signal from the data storage means; and
   second current control means for controlling the current which flows through the current controlled oscillator dependent on the output signal from the data storage means.

2. A current controlled signal processor according to claim 1; wherein said current controlled oscillator, said data storage means, said first current control means, and said second current control means are made of a semiconductor of silicon compounds or the like over a common surface.

3. A current controlled signal processor according to claim 1; wherein the first current control means comprises a plurality of current limiters for controlling the current of the current controlled oscillator, a voltage-current converter for controlling the current of the plurality of current limiters dependent on the external control voltage, and switching means for switching the output of the voltage-current converter to the plurality of current limiters dependent on the output of the data storage means.

4. A current-controlled signal processor comprising:
   a current-controlled oscillator having an output frequency dependent on a control current; control current generating means for generating the control current dependent on stored data, the control current generating means comprising a first current control means receptive of an external control voltage and the stored data for controlling the control current dependent on the external control voltage and the stored data, and second current control means receptive of the stored data for controlling the control current dependent on the stored data; and data storing means for storing the stored data.

5. A current-controlled signal processor according to claim 4; wherein the first current control means comprises a plurality of current limiters for controlling the control current, a voltage-current converter for controlling the current of the plurality of current limiters dependent on the external control voltage, and switching means for switching the output of the voltage-current converter to the plurality of current limiters dependent on the output of the data storage means.

6. A current-controlled signal processor according to claim 4; further comprising external information inputting means for inputting information data to the storing means.

7. A current-controlled signal processor according to claim 4; wherein the current-controlled oscillator, the control current generating means and the data storing means are made of semiconductor material on a common surface.

* * * * *